United States Patent
Shida et al.

(10) Patent No.: US 6,178,621 B1
(45) Date of Patent: Jan. 30, 2001

(54) ELECTRONIC COMPONENT MOUNTING APPARATUS

(75) Inventors: Satoshi Shida, Katano; Wataru Hirai, Osaka; Muneyoshi Fujiwara, Katano; Hiroshi Ohta, Moriguchi; Hirokazu Honkawa, Hirakata, all of (JP)

(73) Assignee: Matsushita Electric Industrial Co., Ltd. (JP)

( * ) Notice: Under 35 U.S.C. 154(b), the term of this patent shall be extended for 0 days.

(21) Appl. No.: 09/029,627
(22) PCT Filed: Jul. 2, 1997
(86) PCT No.: PCT/JP97/02295
§ 371 Date: Apr. 23, 1998
§ 102(e) Date: Apr. 23, 1998
(87) PCT Pub. No.: WO98/02026
PCT Pub. Date: Jan. 15, 1998

(30) Foreign Application Priority Data

Jul. 10, 1996 (JP) .................................... 8-180812

(51) Int. Cl.$^7$ .................................... H05K 3/30
(52) U.S. Cl. ................ 29/740; 29/743; 29/759; 29/721; 901/40
(58) Field of Search .............. 29/740, 743, 721, 29/759, 741, 713, 712, 706; 198/395; 901/40, 49; 414/752; 73/1.08, 1.13, 1.15; 702/101, 102; 177/50, 145; 228/110.1, 1.1, 102

(56) References Cited

U.S. PATENT DOCUMENTS

| | | | |
|---|---|---|---|
| 3,604,184 | * 9/1971 | Shuttleworth | 53/157 |
| 3,618,742 | * 11/1971 | Blachard et al. | 198/33 AB |
| 3,901,392 | * 8/1975 | Streckert | 214/6 FS |
| 4,282,476 | * 8/1981 | Frezzolini et al. | 320/46 |
| 4,516,880 | * 5/1985 | Martin | 405/160 |
| 4,918,956 | * 4/1990 | Schoch | 72/21 |
| 4,939,918 | * 7/1990 | Schoch | 72/20 |
| 5,036,576 | * 8/1991 | Gast | 29/407 |
| 5,230,458 | * 7/1993 | Asanasavest | 228/102 |
| 5,314,105 | * 5/1994 | Farassat | 228/102 |
| 5,330,043 | * 7/1994 | Stuckey | 198/346.2 |
| 5,361,583 | * 11/1994 | Huitema | 60/413 |
| 5,449,265 | * 9/1995 | Legrady et al. | 414/412 |
| 5,727,311 | * 3/1998 | Ida et al. | 29/832 |
| 5,979,737 | * 11/1999 | Farassat | 228/1.1 |

FOREIGN PATENT DOCUMENTS

| | | |
|---|---|---|
| 61-216388 | 9/1986 | (JP) . |
| 61-289693 | 12/1986 | (JP) . |
| 63-199500 | 8/1988 | (JP) . |
| 1-246899 | 10/1989 | (JP) . |
| 2-50499 | 2/1990 | (JP) . |

* cited by examiner

*Primary Examiner*—Carl J. Arbes
*Assistant Examiner*—Minh Trinh
(74) *Attorney, Agent, or Firm*—Parkhurst & Wendel, L.L.P.

(57) ABSTRACT

By lightening the impact load to an electronic component and greatly promoting the load range, the adaptability to the electronic components is enhanced and the manned manual operation is eliminated, thereby improving the productivity and realizing unmanned operation. The vacuum-clamping nozzle unit comprises an automatically detachable vacuum-clamping nozzle (2) for vacuum-clamping the electronic component, a positioning section (3) for positioning the vacuum-clamping nozzle (2) in a rotating direction and a vertical direction, a pushing section (4) for urging said vacuum-clamping nozzle (2) downward by using fluid, a fluid pressure switching section for switching the urging force, a timing switching section for switching the timing of the urging force of said vacuum-clamping nozzle, and a pressure control section for controlling the load to a desired load. Switching the timing of the urging force can be made before or at the time of mounting the electronic component on an electronic circuit board.

4 Claims, 9 Drawing Sheets

LIGHT LOAD TIME PRESSURE PROFILE

FIG. 8(4)

HEAVY LOAD TIME PRESSURE PROFILE

FIG. 8(5)

MOUNTING SPEED PROFILE

ELECTRONIC COMPONENT MOUNTING APPARATUS

FIELD OF THE INVENTION

The present invention relates to an electronic component mounting apparatus for packaging an electronic component onto an electronic circuit board.

BACKGROUND OF THE INVENTION

In recent years, desired functions for an apparatus for mounting an electronic component onto an electronic circuit board have been the speed-up, an improvement in the mounting accuracy of an electronic component, the adaptability to the mounting of multifarious electronic components and an improvement in the quality of an electronic component.

Figure 10:
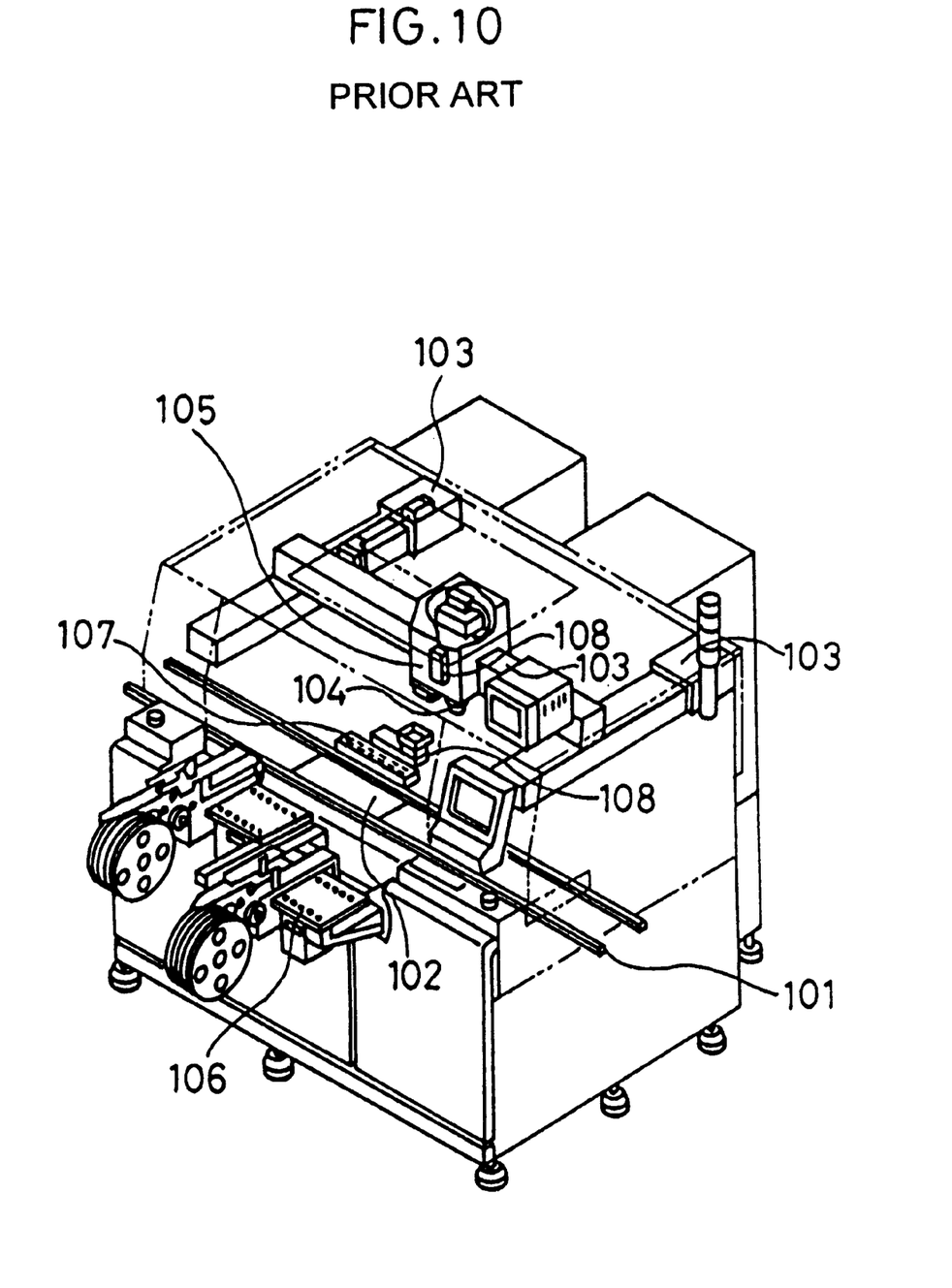
FIG. 10 a perspective view showing the whole outline configuration of a conventional electronic component mounting apparatus.

FIG. 10 is a perspective view showing the whole outline configuration of a conventional electronic component mounting apparatus. In FIG. 10, Numerals 101 and 103 denote carrying means for carrying in/out an electronic circuit board 102 and drive means (XY robot) for positioning a head part 105, incorporating a nozzle unit 104 for vacuum-clamping/mounting the electronic component, at any position. Numerals 106, 107 and 108 denote electronic component supply means for supplying the electronic component, nozzle change part for exchanging a nozzle clamped by the nozzle unit 104 depending on packaged component and recognition section for recognizing the clamping posture of electronic component vacuum-clamped by the nozzle.

Figure 11:
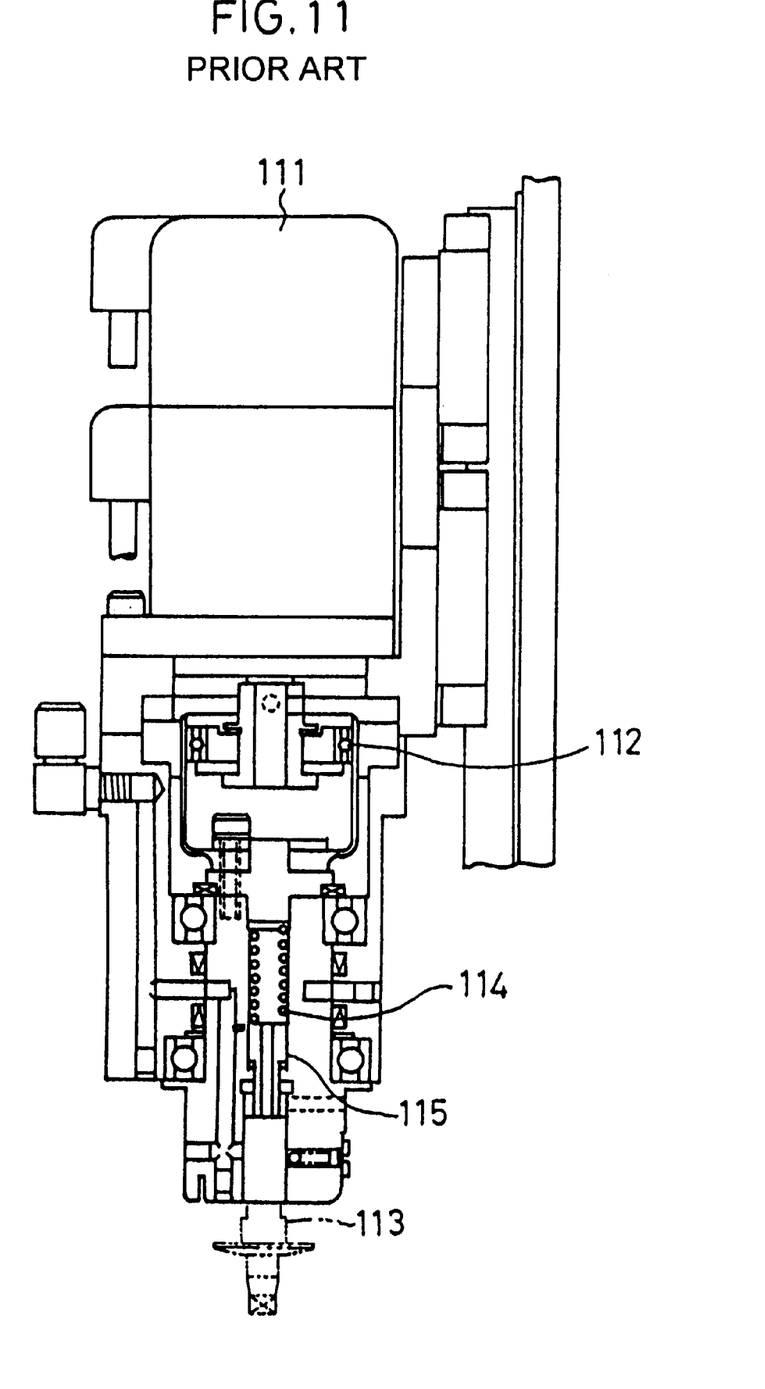
FIG. 11 is a principal sectional view showing the configuration of the nozzle unit of FIG. 10.

FIG. 11 is a principally sectional view showing the configuration of a nozzle unit in a conventional electronic component mounting apparatus. In FIG. 11, Numerals 111, 112, 113, 114 and 115 denote a motor for positioning a rotational position, a speed reducer section for improving the rotational precision, a vacuum-clamping nozzle for vacuum-clamping an electronic component, a spring for urging the vacuum-clamping nozzle 113 and a pushing section for transmitting a spring force.

Next, the operation of an electronic component mounting apparatus (FIG. 10) composed of the above members and of a nozzle unit (FIG. 11) will be described.

The electronic circuit board 102 shown in FIG. 10 is carried in the mounting position by means of the carrying means 101. The drive means 103 positions the head section 105 onto the electronic component supply means 106 and after the positioning, the nozzle unit 104 in the head part 105 lowers to vacuum-clamp the electronic component.

Next, after vacuum-clamping the electronic component, the nozzle unit 104 rises and the head part 105 is positioned to the mounting position by the drive means 103. In this move, the vacuum-clamped posture of the electronic component vacuum-clamped by the nozzle unit 104 is recognized in the recognition section 108 and the control section (not shown) performs a correcting computation to correct the position. After the positional correction, the nozzle unit 104 lowers and mounts the electronic component onto the electronic circuits board 102.

In this electronic component mounting apparatus, the speed at which the nozzle unit 104 lowers is constant and cannot be made variable owing to the mechanism. Besides, the urging force at the time of mounting an electronic component is also defined by the spring 114.

As mentioned above, simply under a definite urging force and only at a definite speed at the lowering time of a nozzle, a conventional electronic component mounting apparatus can mount an electronic component. Thus, an improvement in quality such as reduction of damages to an electronic component is required and furthermore, multiple sorts of electronic components at present leads to a demand for inserting a large-sized connector into an electronic circuit board, so that the need for a function able to exert a heavy load has taken place to implement this.

DISCLOSURE OF THE INVENTION

The present invention is made to solve this problem and its purpose is to deepen the adaptability of multifarious electronic components by reducing an impact load to electronic component and further by greatly extending the range of load.

In order to solve the above problem and to attain the purpose, the present invention has enabled any urging force exerted on the vacuum-clamping nozzle to be set by making the fluid pressure variable, further an urging force to be corrected for each vacuum-clamping nozzle, and the mounting speed of electronic component to be made variable, upon mounting multiple sorts of electronic component onto electronic circuit board.

According to the present invention, various electronic components including those requiring a heavy load and semiconductor elements subject to damages caused by inserted components can be coped with.

The present invention provides an electronic component mounting apparatus comprising component supply means for supplying an electronic component to a predetermined position and a vacuum-clamping nozzle unit for mounting the electronic component onto an electronic circuit board carried by carrying means and positioned at an predetermined position, wherein the above vacuum-clamping nozzle unit comprises an automatically detachable vacuum-clamping nozzle for vacuum-clamping the electronic component, a positioning section for positioning the vacuum-clamping nozzle in a rotating direction and a vertical direction, a pushing section for urging the vacuum-clamping nozzle downward by using fluid, a fluid pressure switching section for switching the urging force, a timing switching section for switching the timing of the urging force of the vacuum-clamping nozzle, and a pressure control section for controlling the load to a desired load.

With the present invention, switching the timing of the urging force can be made before or at the time of mounting the electronic component on an electronic circuit board. When the nozzle is exchanged corresponding to an electronic component requiring a heavy load or an electronic component such as a semiconductor element subject to a damage caused by inserted components, damages to the electronic component can be reduced by correcting the nozzle weight or the like and the component adaptability can be largely extended even to such semiconductor elements that are subject to damages.

BRIEF DESCRIPTION OF THE DRAWINGS

FIGS. 8(1)–(5) are pictorial views explaining the timing of switching the urging force before mounting an electronic component according to one embodiment of the present invention;

FIGS. 9(1)–(6) are pictorial views explaining the timing of switching the urging force at the time of mounting an electronic component according to one embodiment of the present invention;

DESCRIPTION OF THE EMBODIMENTS

Hereinafter, embodiments of the present invention will be described referring to FIGS. 1 to 9.

Figure 1:
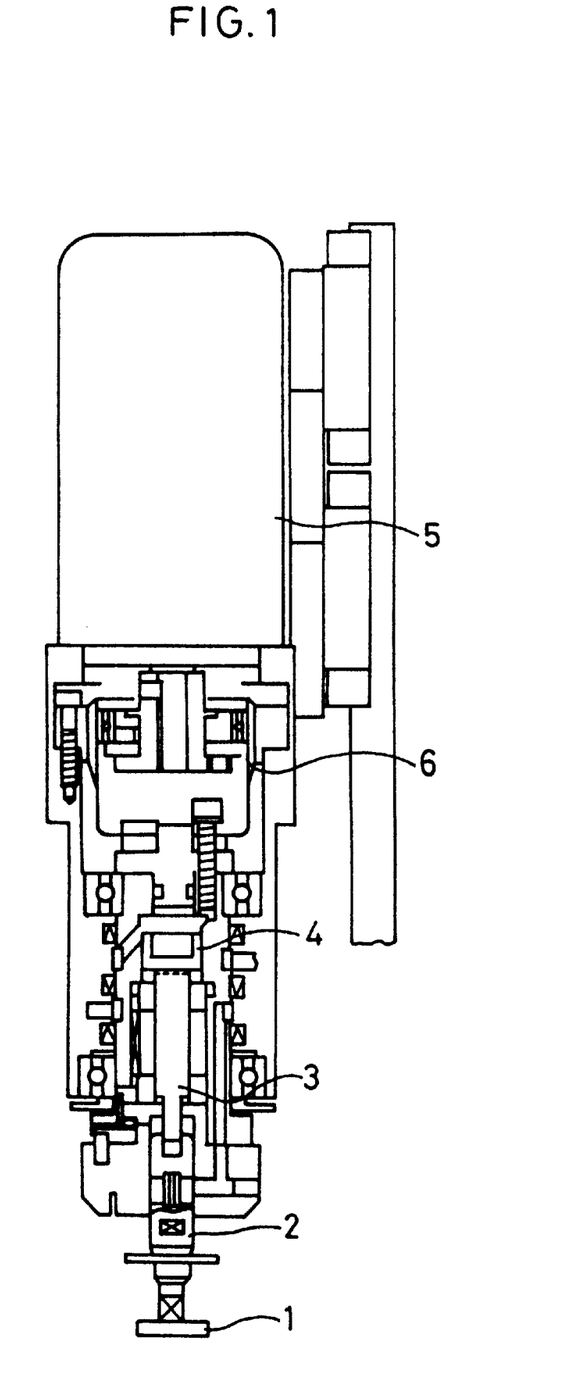
FIG. 1 is a principal sectional view showing the configuration of the vacuum-clamping nozzle unit of an electronic component mounting apparatus according to one embodiment of the resent invention.

FIG. 1 is a principally sectional view showing the configuration of a vacuum-clamping nozzle unit in an electronic component mounting apparatus according to one embodiment of the present invention. In FIG. 1, numerals 1, 2 and 3 denote an electronic component, an vacuum-clamping nozzle for vacuum-clamping the electronic component 1 and a positioning section for positioning the vacuum-clamping nozzle 2 in a rotating direction and a vertical direction and transmitting an urging force. As this positioning section, a ball spline or the like can be employed and is preferable especially in that the frictional resistance in sliding is low owing to the use of the rolling motion of a rigid ball. Numeral 4 denotes a pushing section for converting the received fluid pressure into an actual load. This pushing section consists of a piston or rubber. As the piston, a hardened steel can be used and is preferable especially in that the liquid leakage between the holder and the piston can be prevented because of good wear resistance thereof and ease in developing machining precision inherent thereto. On the other hand, rubber is preferable in that a so-called bellophragm is usable and especially in that the sliding friction is low by use of the rolling motion of rubber and in that no liquid leakage takes place and a uniform pressure is easily exerted. Numerals 5 and 6 denote a motor for performing a rotating motion and a speed reducer section for improving the rotating precision of the motor 5. As this speed reducer section, harmonic or ball reduction gears with a small back lash are available.

Figure 2:
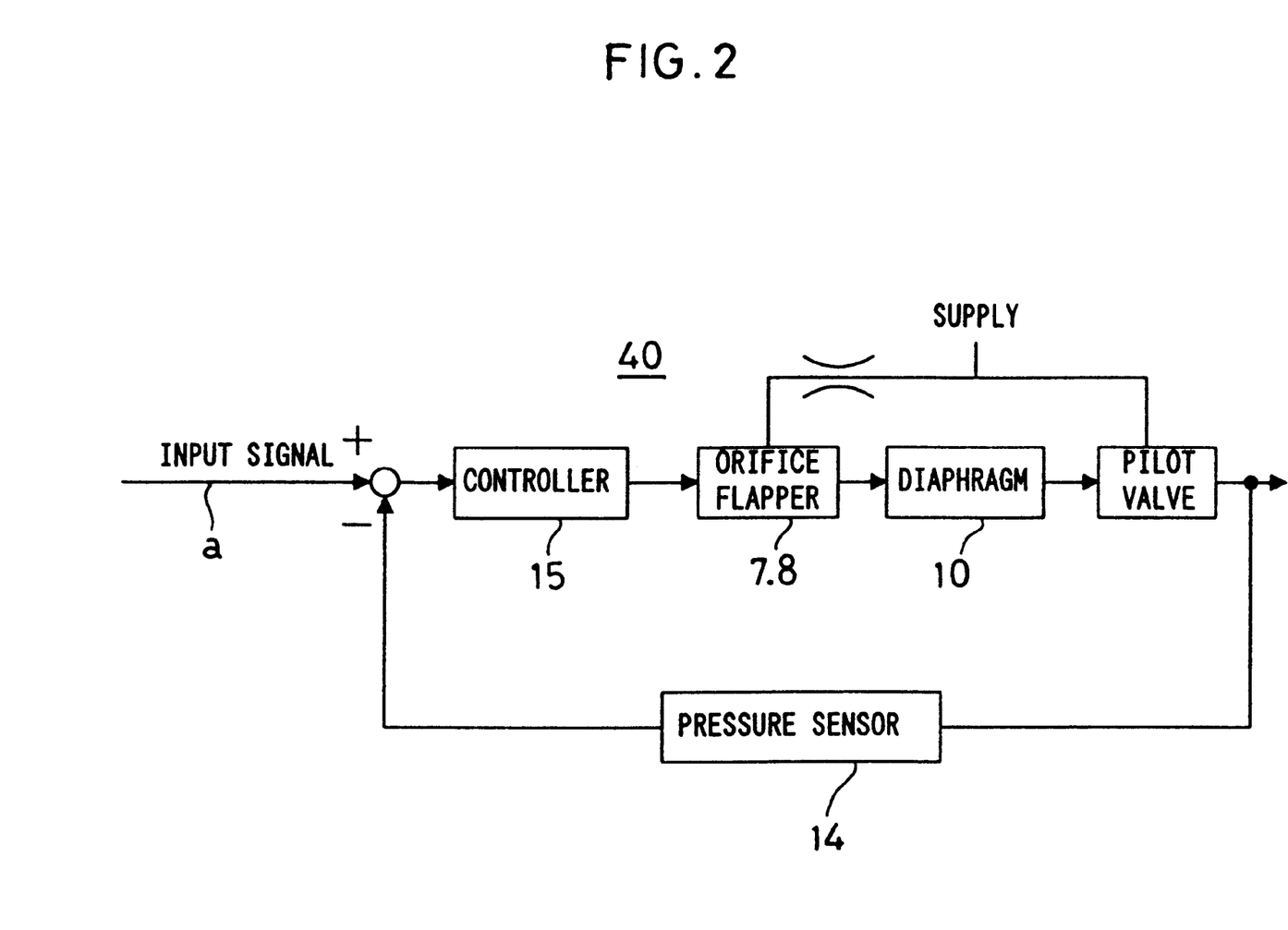
FIG. 2 is an operational block diagram of an electric air regulator for switching the fluid pressure on the pushing section shown in FIG. 1.
Figure 3:
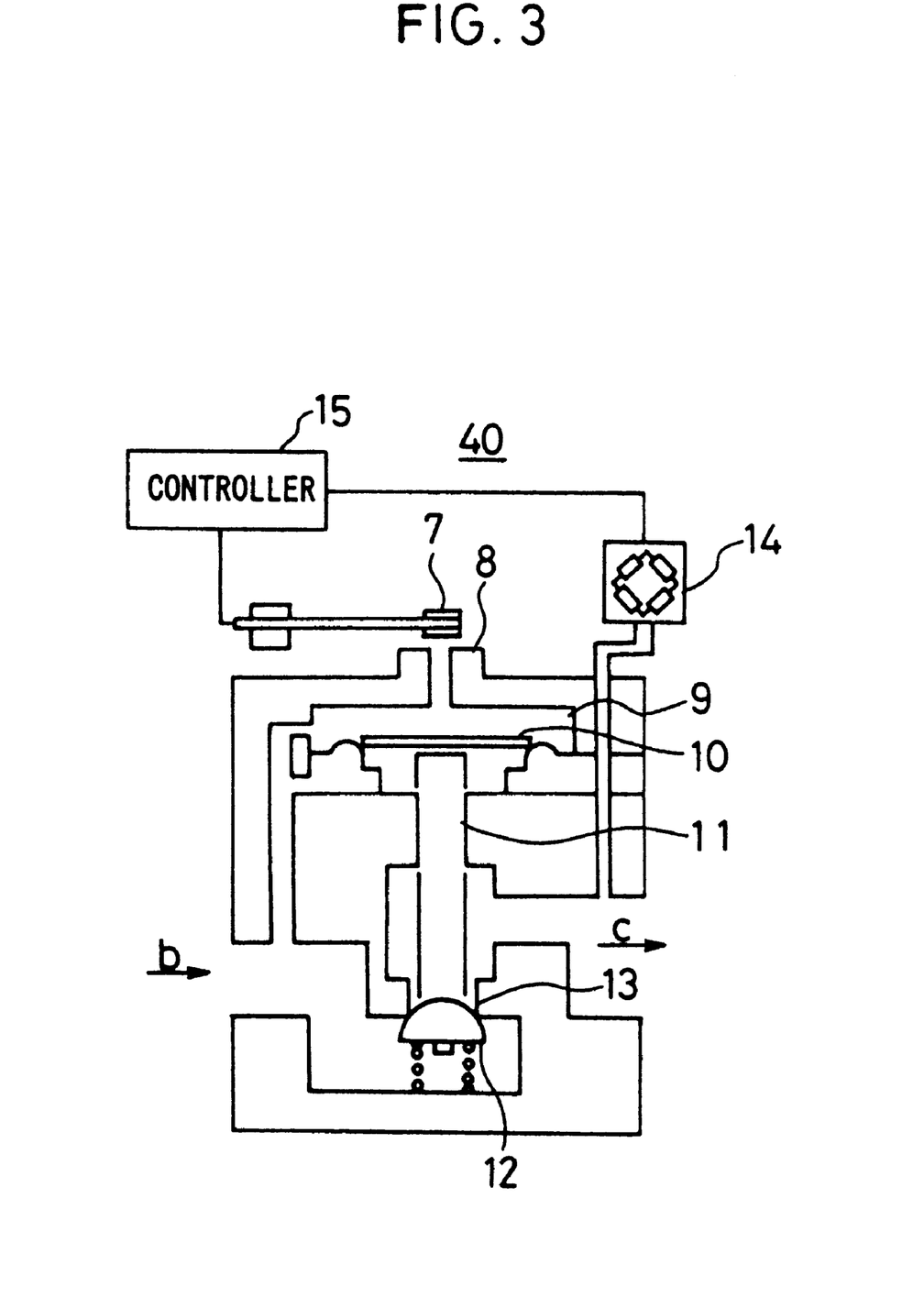
FIG. 3 is a pictorial view explaining the operation principle of the air regulator shown in FIG. 2.

FIG. 2 is an operational block diagram of an electric air regulator 40 for switching the fluid pressure imposed on the pushing section 4 shown in FIG. 1. FIG. 3 is a diagram explaining the operation principle of the electric air regulator 40 of FIG. 2. Here, the operation of the electric air regulator 40 shown in FIGS. 2 and 3 will be described. First, when an input signal a increases, a flapper 7 made of a piezoelectric element bends in such a direction as to close an orifice 8 and the pressure of a back pressure section 9 rises. The above pressure acts on the upper portion of the diaphragm 10 to push an exhaust valve 11 down, the valve 12 linking with this moves downward and a supply port 13 opens. Part of the supply pressure b forms an output pressure c via the supply port 13. This output pressure c is converted via a pressure sensor 14 into an electric signal and fed back to a controller 15. Thereby, a minute pressure can be controlled. And, a target output pressure c is exerted to the pushing section 4 and converted into an actual load.

Figure 4:
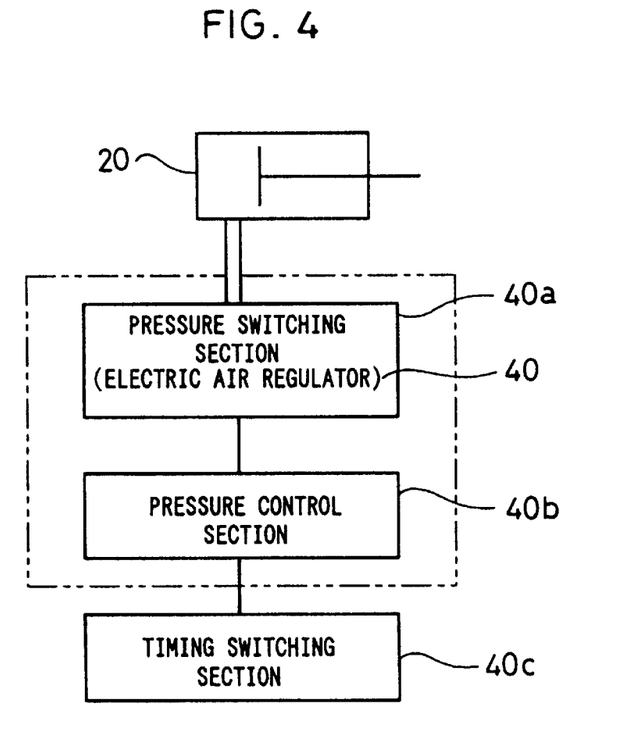
FIG. 4 is a block diagram of a system for switching the pressure of a load (urging force) switching nozzle unit according to the present invention.

FIG. 4 is a block diagram of a system for switching the pressure of a load (urging force) switching nozzle unit 20. In FIG. 4, a pressure switching section 40a is the electric air regulator 40 explained in FIGS. 2 and 3, a pressure control section 40b D/A-converts a predetermined load to send a predetermined electric signal to the electric air regulator 40. A timing switching section 40c serves to modify the voltage of the electric air regulator 40 to modify the timing, which is performed by the main controller.

Figure 5:
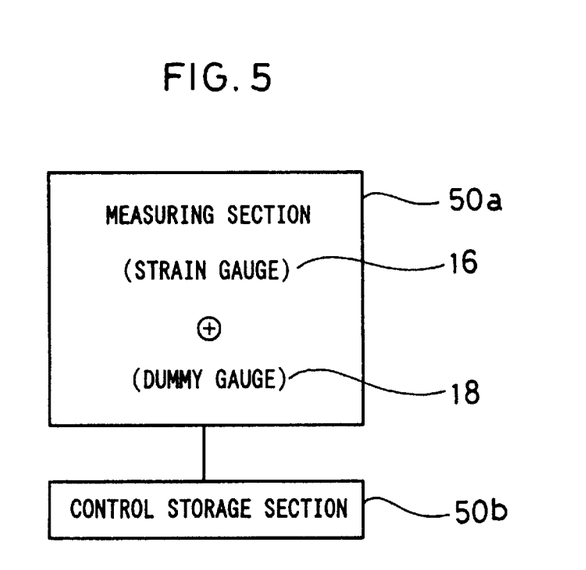
FIG. 5 is block diagram of a load correcting system according to one embodiment of the present invention.

FIG. 5 is a block diagram of a system for correcting a load. In FIG. 5, the measuring section 50a comprises a dummy gauge 18 of a jig for the measurement and a strain gauge 16 for measuring an actual load, while a control storage section 50b is a main controller for storing the above measured load result.

Figure 6:
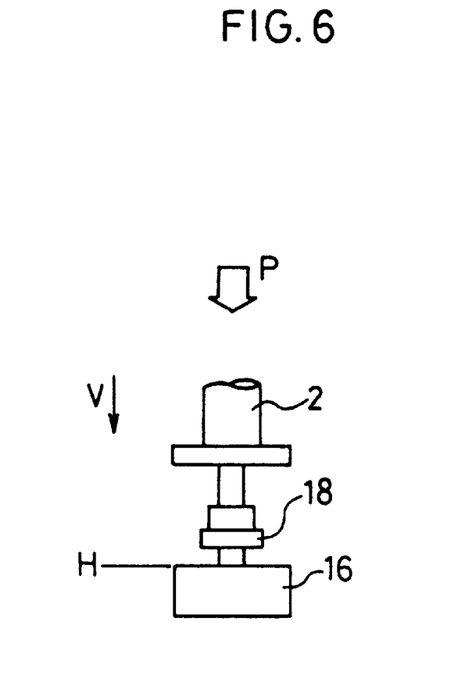
FIG. 6 is a pictorial view explaining the operating mechanism of the measuring section of FIG. 5.
Figure 7:
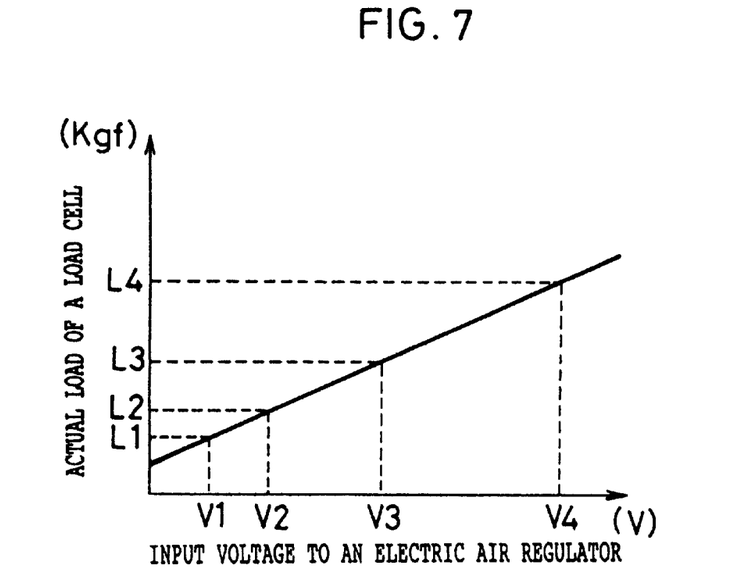
FIG. 7 is a graph showing the load profile between an input current and an actual load according to one embodiment of the present invention.
Figure 8:
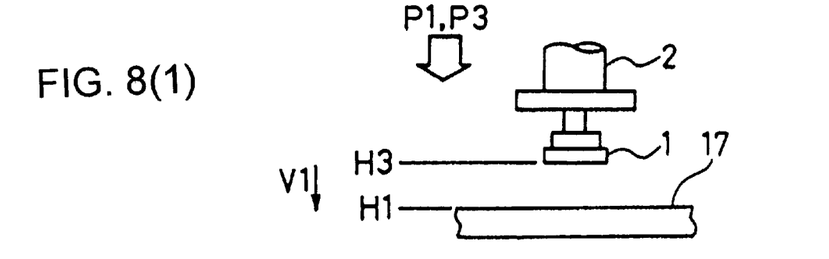
Figure 9:
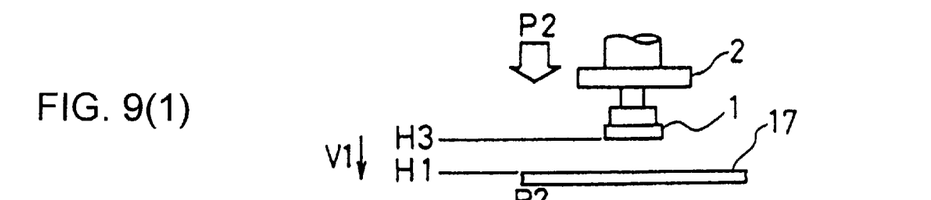

FIG. 6 is a drawing showing the operating mechanism of the measuring section 50a of FIG. 5. The measuring procedure comprises as follows: first, the vacuum-clamping nozzle 2 vacuum-clamps a dummy gauge 18, lowers down to any set nozzle height H at a lowering speed V, and is earthed to the strain gauge 16. At this time, as shown in FIGS. 2 and 3, a voltage is applied to the electric air regulator 40 by a minute unit, then the load outputted from the strain gauge 16 is measured to make up the load profile. FIG. 7 shows the relation between the input voltage and the actual load at that time, where the input voltage (V) to the electric air regulator 40 is taken as the abscissa and the actual load (kgf) of the load cell is taken as ordinate. That is, as seen from FIG. 7, the input voltage and actual load are in a proportional relation.

Thereby, this load profile is inputted as data to the control section of the electronic component mounting apparatus. Based on the above data, the voltage to be inputted to the electric air regulator 40 can be evaluated from the load required as the object to switch the load in an arbitrary manner.

FIGS. 8 and 9 are illustrations of the switching timing of an urging force of the load (urging force) switching nozzle unit. Here, FIG. 8 shows the switching timing of an urging force before the mounting of an electronic component, and numeral 17 in FIG. 8 denotes an electronic circuit board. FIGS. 8 (1) and (2) show operation changing states of the vacuum-clamping nozzle 2, FIGS. 8 (3) and (4) show pressure profiles for low and high loads, and FIG. 8 (5) shows a profile of mounting speed. In the state of vacuum-clamping the electronic component 1, as shown in FIGS. 8 (1) and (5), the vacuum-clamping nozzle 2 lowers at high speed V1 from the position of a nozzle origin height H3 to that of a nozzle speed switching height H2 shown in FIGS. 8 (2) and (5).

At the time of this origin height H3, a command input voltage (V) is given to the electric regulator 40 based on the load profile (FIG. 7), and the pressure is switched from a normal pressure P2 to a high pressure P3 for a heavy load (FIG. 8 (4)) or from the normal pressure P2 to a low pressure P1 for a low load (FIG. 8 (3)) to change an urging force of the pushing section of the urging force switching nozzle unit. Thereafter, after lowering to the position of the nozzle speed switching height H2, the nozzle 2 lowers to the top face height H1 of the electronic circuit board 17 at the nozzle speed switched to low speed V2 as shown in FIG. 8 (5), and applies a load on the electronic component 1 so as to be mounted ononto the electronic circuit board. After the mounting, the pressure is returned to the normal pressure P2 at any nozzle height H.

FIG. 9 shows the urging force switching timing at the time of mounting an electronic component, where FIGS. 9 (1) to (3) show the operation changing state of the vacuum-clamping nozzle 2, FIGS. 9 (4) and (5) show pressure profiles for light and heavy loads, and FIG. 9 (6) shows an adsorption speed profile. First, in the state of vacuum-clamping the electronic component 1, as shown in FIGS. 9 (1) and (6), the vacuum-clamping nozzle 2 lowers from the position of the nozzle origin height H3 at the high speed V1 to the position of the nozzle speed switching height H2 as shown in FIGS. 9 (2) and (6). Thereafter, after lowering to the position of the nozzle speed switching height H2, the nozzle 2 lowers to the position of the top face height H1 of the electronic circuit board 17, as shown in FIG. 9 (3), at the nozzle speed V2 switched to low as shown in FIG. 9 (6). At this time when the nozzle 2 has lowered, the command input voltage (V) is given to the electric regulator 40 based on the load profile (FIG. 7), and the pressure is switched from the normal pressure P2 to the high pressure P3 under a high load (FIG. 9 (5)) and from the normal pressure P2 to the low pressure P1 under a low load (FIG. 9 (4)). In this way, the urging force of the pushing section in the urging force switching nozzle unit is changed and the electronic component 1 is applied with a load so as to be mounted onto the electronic circuit board. After the mounting, the pressure is returned to the normal pressure P2 at an arbitrary nozzle height H.

As described above, because of the provision of a mechanism for arbitrarily switching the urging force by using a fluid, the provision of a mechanism for automatically correcting the urging force by using a strain gauge when changing a nozzle in correspondence to the kind of electronic components, and the provision for switching the mounting lowering speed to an arbitrary speed depending on an arbitrary nozzle height, the electronic component mounting apparatus according to the present invention enables it to reduce the damage that has been given to electronic components and to enhance its adaptability to those such as semiconductor element components subject to micro-cracks to be enhanced, thus bringing about a greatly marked improvement in quality.

Besides, the present invention enables it to package heteromorphic electronic components having a heavy load such as connectors which have formerly been unadaptable to the mounting, to largely increase the object components to be handled, and further to eliminate the manned manual work, thus realizing the productivity improvement and unmanned operation.

What is claimed is:

1. An electronic component mounting apparatus comprising component supply means for supplying an electronic component to a predetermined position and a vacuum-clamping nozzle unit for mounting the electronic component onto an electronic circuit board carried by carrying means and positioned at a predetermined position, wherein said vacuum-clamping nozzle unit comprises:

an automatically detachable vacuum-clamping nozzle for vacuum-clamping an electronic component;

a positioning section for positioning said vacuum-clamping nozzle in a rotating direction and a vertical direction;

a pushing section for urging said vacuum-clamping nozzle downward by using fluid;

a fluid pressure switching section for providing a variable urging force;

a timing switching section for controlling timing of the application of the urging force of said vacuum-clamping nozzle; and a pressure control section for regulating the urging force to a desired force in accordance with the electronic component to be mounted on the electronic circuit board;

whereby the force for mounting the electronic component can be varied.

2. An electronic component mounting apparatus as set forth in claim 1, wherein switching of the timing of the urging force is made before or at the time of mounting the electronic component on an electronic circuit board.

3. An electronic component mounting apparatus as set forth in claim 1, further comprising a measuring section for using said vacuum-clamping nozzle to vacuum-clamp a dummy gauge and using a strain gauge to measure a mounting load, and a control storage section for storing the measured result of the load in advance, so that any arbitrary mounting load can be set.

4. An electronic component mounting apparatus as set forth in claim 1, wherein said timing switching section is for switching an apparatus lowering speed to an arbitrary speed at an arbitrary nozzle height.

* * * * *